United States Patent
Cohen et al.

(10) Patent No.: US 9,215,817 B1
(45) Date of Patent: Dec. 15, 2015

(54) RETENTION SYSTEM FOR DYNAMIC LOADING

(71) Applicant: Apple Inc., Cupertino, CA (US)

(72) Inventors: Sawyer I. Cohen, Sunnyvale, CA (US); Ashutosh Y. Shukla, Santa Clara, CA (US); Edward S. Huo, San Jose, CA (US); Michael Benjamin Wittenberg, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 26 days.

(21) Appl. No.: 14/329,823

(22) Filed: Jul. 11, 2014

Related U.S. Application Data

(63) Continuation of application No. PCT/US2014/046422, filed on Jul. 11, 2014.

(51) Int. Cl.
*G06F 1/16* (2006.01)
*H05K 5/00* (2006.01)
*H05K 5/02* (2006.01)

(52) U.S. Cl.
CPC ............ *H05K 5/0208* (2013.01); *G06F 1/1633* (2013.01); *H05K 5/0221* (2013.01)

(58) Field of Classification Search
CPC ............ G06F 1/1633; G06F 2201/465; H05K 5/0013; H05K 5/0208; H05K 5/0221
USPC ................... 361/679.58; 455/575.1
See application file for complete search history.

(56) References Cited

U.S. PATENT DOCUMENTS

| | | | | |
|---|---|---|---|---|
| 3,409,257 A | * | 11/1968 | Elm | F16L 3/08 248/205.3 |
| 5,143,371 A | * | 9/1992 | Strahan | A47L 25/00 15/105 |
| 5,295,278 A | * | 3/1994 | Condon | A46B 5/0012 15/104.04 |
| 5,381,922 A | * | 1/1995 | Gladman | A45F 5/02 220/480 |
| 5,383,098 A | * | 1/1995 | Ma | H04B 1/3833 174/371 |
| 5,613,237 A | * | 3/1997 | Bent | H04B 1/086 220/4.02 |
| 5,818,691 A | | 10/1998 | McMahan et al. | |
| 6,427,293 B1 | * | 8/2002 | Bowes, Jr. | F16B 45/02 24/114.6 |

(Continued)

FOREIGN PATENT DOCUMENTS

| | | |
|---|---|---|
| KR | 10-0458180 B1 | 12/2004 |
| KR | 10-1137244 B1 | 4/2012 |

OTHER PUBLICATIONS

International Search Report and Written Opinion mailed Mar. 26, 2015 for PCT Application No. PCT/US2014/046422.

*Primary Examiner* — Adrian S Wilson
(74) *Attorney, Agent, or Firm* — Downey Brand LLP

(57) ABSTRACT

A system and method for retaining enclosure components of an electronic device that can experience a range of dynamic forces is disclosed. The electronic device includes a cover component and a housing component. The electronic device also contains a retention system that includes a spring clip and a compressible layer for retaining a portion of the cover component to the housing component. The retention system provides a variable retention force that resists the separation of the cover and housing components. If the electronic device experiences a force that is applied abruptly, such as in the case of an unintentional drop event, the variable retention force is high, increasing the retention between the cover and housing components. If the electronic device experiences a slower and gradual force, such as in the case of intentional disassembly, the variable retention force is low, allowing the disassembly of the electronic device.

20 Claims, 12 Drawing Sheets

(56) References Cited

U.S. PATENT DOCUMENTS

| | | | | |
|---|---|---|---|---|
| 6,894,739 B2* | 5/2005 | Sung | | G02F 1/133308 349/58 |
| 6,902,431 B2* | 6/2005 | Chen | | H01R 13/60 439/574 |
| 7,209,195 B2* | 4/2007 | Lin | | G02F 1/133308 349/58 |
| 7,429,700 B2* | 9/2008 | Kanamaru | | H01R 13/6271 174/135 |
| 7,544,887 B2* | 6/2009 | Iizuka | | H02G 3/081 174/135 |
| 7,697,269 B2* | 4/2010 | Yang | | B29C 66/542 361/679.01 |
| 7,940,287 B2* | 5/2011 | Kim | | G02F 1/133308 345/102 |
| 8,276,235 B2* | 10/2012 | Naughton | | A45F 5/02 15/118 |
| 8,480,186 B2* | 7/2013 | Wang | | H05K 5/0013 312/223.1 |
| 2004/0038121 A1 | 2/2004 | Song et al. | | |
| 2004/0121226 A1* | 6/2004 | Kaelin | | H01M 2/1044 429/96 |
| 2007/0003827 A1* | 1/2007 | Zuo | | H01M 2/1066 429/97 |
| 2007/0052100 A1* | 3/2007 | Bellinger | | H01R 4/48 257/758 |
| 2008/0157485 A1* | 7/2008 | Isono | | F16J 15/062 277/638 |
| 2008/0190975 A1* | 8/2008 | Naughton | | A45F 5/02 224/269 |
| 2009/0175020 A1* | 7/2009 | Zadesky | | G06F 1/1626 361/818 |
| 2009/0320533 A1 | 12/2009 | Ruan et al. | | |
| 2010/0061044 A1* | 3/2010 | Zou | | B32B 3/02 361/679.01 |
| 2011/0273823 A1* | 11/2011 | Lamers | | H04M 1/0249 361/679.01 |
| 2012/0106035 A1* | 5/2012 | Chen | | E05C 19/06 361/679.01 |
| 2013/0027862 A1* | 1/2013 | Rayner | | G06F 1/1656 361/679.3 |
| 2013/0050945 A1* | 2/2013 | Diep | | G06F 1/181 361/704 |

\* cited by examiner

RETENTION SYSTEM FOR DYNAMIC LOADING

CROSS-REFERENCE TO RELATED APPLICATION

This is a continuation of International Application No. PCT/US14/46422 filed Jul. 11, 2014, entitled "Retention System for Dynamic Loading," which is incorporated herein by reference in its entirety.

FIELD

The present disclosure relates generally to methods and apparatus for retaining objects. More specifically, the present embodiments relate to a retention system for retaining enclosure components of an electronic device that can experience a range of dynamic forces.

BACKGROUND

An electronic device can be assembled from multiple enclosure components that house or enclose an internal portion of the electronic device. For example, a laptop base can include a bottom case and a top case that are coupled such that, when assembled, the cases cooperate to enclose internal components of the laptop. In some scenarios, enclosure components can be intentionally separated in order to allow access to the internal components of the electronic device such as in the case when an electronic device is disassembled in preparation for a rework operation (i.e., repairs or upgrades to the internal components). Unfortunately, enclosure components that can be separated can provide a number of design challenges. During a drop event, e.g., when a user drops his or her mobile phone, the electronic device can experience an impact that causes one or more of the enclosure components to inadvertently separate, break apart, and/or shift out of place. Enclosure components having similar weight, similar geometry, and/or few attachment points are particularly prone to separation during drop events. In some instances, a drop event that causes enclosure components to inadvertently separate can greatly increase a risk of disconnection of one or more internal components of the electronic device and/or permanent damage to those internal components.

Therefore what is desired is a system to prevent inadvertent separation of an electronic device's enclosure components when the electronic device is subjected to abrupt, unintentional forces, while maintaining the ability for the enclosure components to be intentionally separated, such as in the case when an electronic device is disassembled in preparation for a rework operation.

SUMMARY

This paper describes various embodiments that relate to preventing the unintentional disassembly of an electronic device.

In a first embodiment, an electronic device having a first housing component, a second housing component, and a retention system is disclosed. The first housing component includes an attachment feature and the second housing component includes a number of walls that define a cavity. The retention system couples the first housing component to the second housing component. The retention system includes a spring clip coupled with an interior surface of a wall of the second housing component. The spring clip includes a first retention member and a second retention member that cooperate to retain the attachment feature of the first housing component. The first and second retention members are pre-tensioned, or biased, together by a spring force that opposes separation of the retention members. The retention system also includes a compressible layer that exerts a reaction force on the second retention member in response to an externally applied force. A magnitude of the reaction force is proportional to a rate at which the external force is applied. The reaction force and spring force cooperate to oppose separation of the first and second retention members and resists the release of the attachment feature from the spring clip.

In another embodiment, a retention system for resisting disassembly of an electronic device is disclosed. The retention system includes a spring clip having a first retention member and a second retention member biased together by a spring force that opposes separation of the retention members. The retention system also includes a compressible layer disposed against an outer surface of the second retention member. When an extraction force is exerted on the compressible layer by way of the second retention member, the compressible layer cooperates with the spring clip to oppose separation between the first and second retention members by exerting a reaction force upon the second retention member. A magnitude of the reaction force is in accordance with a rate at which the extraction force is exerted on the compressible layer.

In another embodiment, a method for assembling a retention system within an electronic device is disclosed. The retention system includes a compressible layer operable to exert a variable reaction force that cooperates with a spring clip to prevent an opening of the spring clip when an insertion force is applied to the spring clip at a rate greater than a threshold value. The method includes mounting the spring clip within an interior portion of a first housing component such that the spring clip directly contacts the compressible layer. Next, an insertion force is applied to the spring clip with an attachment feature of a second housing component at a rate less than the threshold value, thereby causing the spring clip to open and receive the attachment feature of the second housing component.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The described embodiments may be better understood by reference to the following description and the accompanying drawings. Additionally, advantages of the described embodiments may be better understood by reference to the following description and accompanying drawings in which.

DETAILED DESCRIPTION

Figure 1:
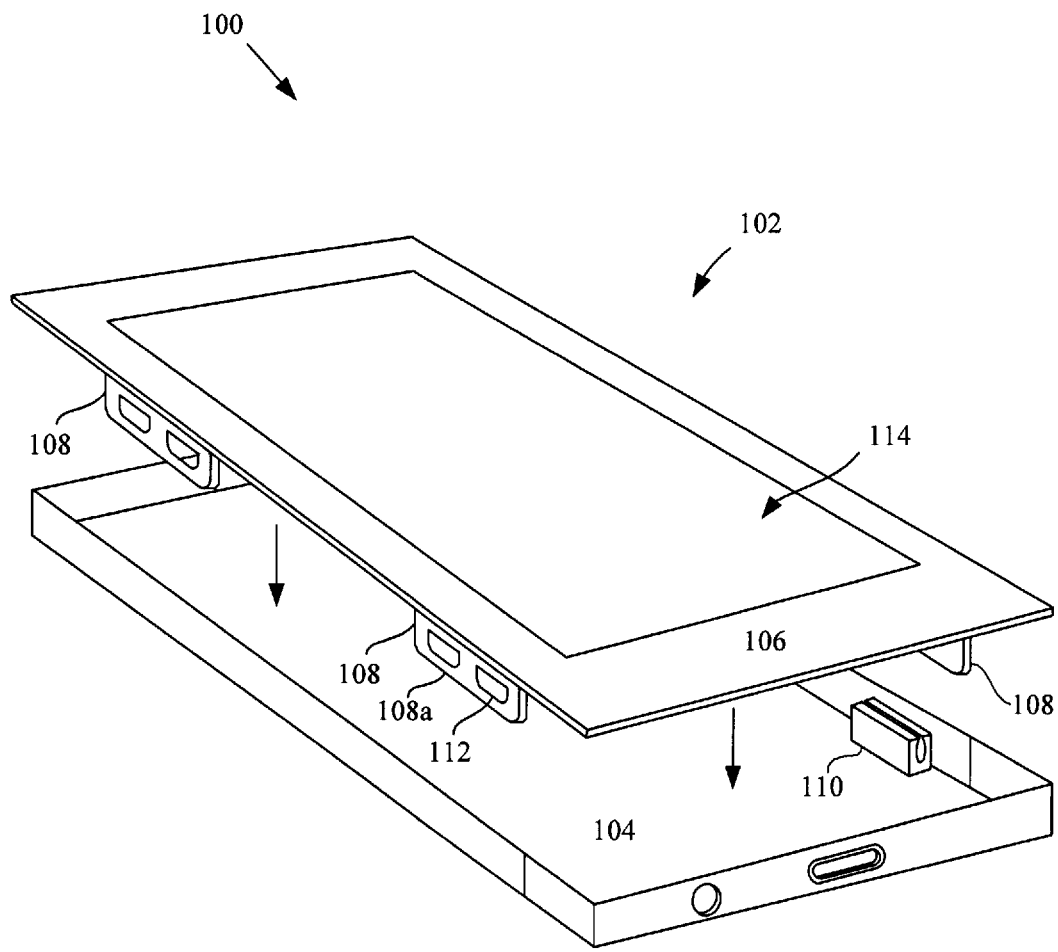
FIG. 1 shows a perspective view of an electronic device in accordance with some embodiments.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

A retention system for preventing unintentional disassembly of an electronic device is disclosed. The electronic device can include a number of enclosure components that include a cover component and a housing component. In an assembled state, the cover and housing components cooperate to enclose an internal portion of the electronic device. For example, the housing component can define an opening to receive the cover component. When the cover component is received, the cover and housing components can be coupled together by various techniques including, but not limited to, friction fitting, fastening systems, magnetic systems, and/or adhesives. To remove or separate the cover component from the housing component, a sufficient force is exerted on either enclosure component in order to pull the enclosure components apart. Although embodiments herein describe components of an electronic device taking the form of a housing component and/or a cover component, this is for illustrative purposes only and it should be appreciated that the embodiments described herein can be applicable to other types of enclosure components of an electronic device.

A retention system disposed within the internal portion of the electronic device can provide a variable retention force that resists separation of the cover component from the housing component. The variability of the retention force can depend on a rate at which a force is exerted on the electronic device. For example, the retention force can be proportional to the rate at which the force is exerted on the electronic device. In this regard, when the electronic device is subjected to a force that is applied quickly or abruptly, the retention system responds by providing a high retention force, thereby increasing a likelihood that the cover and housing components will remain assembled together. Typically, a force that is applied abruptly to the electronic device is associated with an unintentional event such as when an electronic device is accidently dropped on a hard surface. When the electronic device is subjected to a force that is applied in a slower and more gradual manner, the retention system responds by providing a low retention force, thereby allowing removal of the cover component from the housing component. Typically, a force that is applied slowly and/or gradually to the electronic device is associated with an intentional event such as an initial disassembly operation associated with a rework operation. Consequently, the retention system can assist in distinguishing intentional events from unintentional events and provide an appropriate response for resisting separation of the cover component from the housing component.

In one specific embodiment, the retention system can include a spring clip that is mounted within an internal portion of the housing component. The spring clip can include two arms or retention members that provide a spring force by pre-tensioning the arms toward each other such that the arms exert a force upon one another. In this state, the arms can define a retaining region, or retaining boundary, for retaining an object within the spring clip. When a force exerted upon the spring clip causes the arms to move away from each other, a separation between the arms defines an opening that can allow the passage of an object into or out of the retaining region (i.e., the spring clip retains or releases the object).

The cover component can include an attachment feature suitable for interaction with the spring clip. In one embodiment, the attachment feature can be formed by a rail that defines one or more openings, or "windows." A leading edge portion of the rail can define at least one side of an opening. During the assembly of the cover and housing components, the leading edge portion can engage the spring clip, causing the arms to "snap" around the leading edge portion and to secure the leading edge portion within the retaining region. In this regard, the leading edge portion exerts a force, referred to as an insertion force, on the spring clip that causes the arms to separate, allowing the leading edge portion to pass into the retaining region defined by the arms. Once the leading edge portion passes into the retaining region, the pre-tensioning of the spring clip causes the arms to "snap" back into place thereby trapping the leading edge portion within the retaining region. Accordingly, the leading edge portion must be released from the spring clip in order to release the rail, thereby allowing separation of the cover component from the housing component.

To release the rail from the spring clip, the leading edge portion can exert a force, referred to as an extraction force, on the spring clip. The extraction force can be exerted upon the spring clip by pulling the cover and housing components apart with an external force. In this way, the extraction force can be exerted in a substantially opposite direction with respect to the insertion force. When the extraction force has a magnitude sufficient to cause the arms of the spring clips to separate, the leading edge portion passes through a separation between the arms, thereby releasing the rail from the spring clip. The extraction force can be a consequence of an intentional event (e.g., preparation for a rework operation) or an unintentional event (e.g., drop event). The variable force response portion of the retention system that helps distinguish between an intentional and an unintentional event can be provided by a compressible layer that adds to the force provided by the spring clip.

The compressible layer cooperates with the spring clip to provide a dynamic response for retaining the rail when the leading edge portion exerts the extraction force on the spring clip. The compressible layer can be disposed between an arm of the spring clip and an interior surface of the housing component so that when the leading edge portion exerts the extraction force on the spring clip, the extraction force is transmitted to the compressible layer by way of the arm. In this regard, the extraction force causes the arm to press against and compress the compressible layer. When pressed against, the compressible layer responds by providing an opposing force, referred to as a reaction force, which resists the arm's movement and thereby resists separation of the spring clip's arms. In this regard, the reaction force cooperates with the spring force to retain the rail by minimizing or preventing separation of the arms. Accordingly, the retention force of the retention system can be characterized as a combination of the reaction force and the spring force. Due in part to material properties of the compressible layer, the reaction force is dependent upon a rate at which the extraction force is exerted upon the compressible layer. When the leading edge portion slowly engages the spring clip, the compressible layer responds with a reaction force that is low whereas when the leading edge portion quickly engages the spring clip, the compressible layer responds with a reaction force that is high.

These and other embodiments are discussed below with reference to FIGS. 1-9; however, those skilled in the art will readily appreciate that the detailed description given herein with respect to these figures is for explanatory purposes only and should not be construed as limiting.

FIG. 1 shows a perspective view of an electronic device 100 in accordance with some embodiments. Electronic device 100 includes cover component 102 and housing component 104. Housing component 104 can include a number of walls that define a cavity, or opening, that can receive cover component 102. In this regard, when assembled, housing component 104 and cover component 102 cooperate to enclose internal components of electronic device 100. Cover component 102 can include protective cover 106 that covers the cavity defined by housing component 104. Protective cover 106 can be a substantially rigid substrate. For example, protective cover 106 can be made of tempered glass or any other robust transparent material. One or more rails 108 can extend from a bottom surface of protective cover 106. Each rail 108 can work in conjunction with a corresponding retention apparatus 110 disposed within housing component 104 to assist in keeping cover component 102 and housing component 104 in an assembled state. For example, each rail 108 can include one or more openings 112 defined in part by a leading edge portion 108a of rail 108 that retention apparatus 110 can latch or clip onto. In some embodiments, cover component 102 can also include a display assembly 114 disposed at a bottom surface of protective cover 106. In this regard, in addition to functioning as a cover for housing component 104, cover component 102 also provides display functionality for electronic device 100. For example, in the case where electronic device 100 is a smart phone, display assembly 114 can provide touch-screen display functionality. In some embodiments, circuitry can also be mounted along a bottom surface of cover component 102. The circuitry can be associated with display assembly 114 or can include other, independent electronic components that are mounted along the bottom surface of protective cover 106 in order to maximum interior space of electronic device 100 when cover component 102 and housing component 104 are assembled. For example, a forward facing camera module can be affixed to the bottom surface of protective cover 106.

Although embodiments herein depict electronic device 100 taking the form of a mobile phone, this is for illustrative purposes only and it should be appreciated that electronic device 100 can take the form of other devices. By way of non-limiting example, electronic device 100 can also be embodied as a tablet computing device, a laptop computing device, a user interface device, a media player, a wearable computing device, and/or any electronic device that can be assembled from multiple enclosure components.

Figure 2:
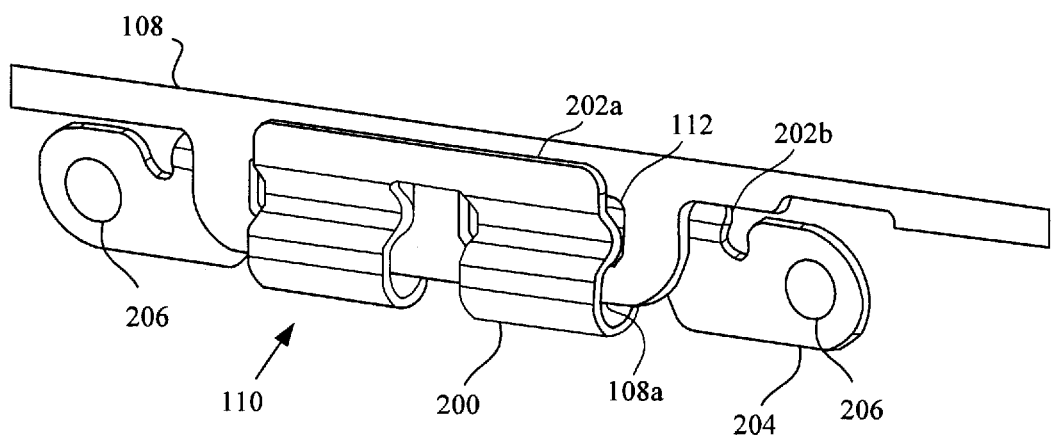
FIG. 2 shows a perspective view of a rail retained by a retention apparatus in accordance with some embodiments.

FIG. 2 shows a perspective view of rail 108 when retained by a retention apparatus 110. Retention apparatus 110 can include a spring clip 200 that is configured to receive and retain rail 108. Spring clip 200 can include an arm 202a and an arm 202b. In a closed state, arm 202a and arm 202b are biased toward each other such that portions of each arm define a retaining region. In this regard, spring clip 200 exerts a spring force that biases arm 202a and arm 202b towards the closed state. Spring clip 200 can be transitioned from a closed state to an open state to receive rail 108 when leading edge portion 108a applies an insertion force sufficient to separate arms 202a and 202b, allowing leading edge portion 108a to pass through a separation between the arms. Subsequently, spring clip 200 can transition back to a closed state once leading edge portion 108a is received in order to retain leading edge portion 108a in the retaining region. In this embodiment, spring clip 200 is interlocked within one or more openings, e.g., opening 112, of rail 108 such that arm 202a and arm 202b are on opposite sides of rail 108 as shown in FIG. 2. Retention apparatus 110 can also include one or more mounting portions 204. Mounting portion 204 can be configured to mount retention apparatus 110 to an interior portion of housing component 104. For example, mounting portion 204 can include an opening 206 that corresponds to a fastening feature (not depicted) disposed within an interior portion of housing component 104 such that when a fastener (e.g., a screw) is driven through opening 206 and into the fastening feature (e.g., threaded opening) of housing component 104, retention apparatus 110 is coupled with the housing component 104. In this embodiment, mounting portion 204 extends from arm 202b and is integrally formed from the same piece of material as arm 202b.

In some embodiments, retention apparatus 110 can be formed from stainless steel (SUS). For example, retention apparatus 110 can be formed from SUS Grade 301. SUS Grade 301 can provide desired properties including spring resiliency, elongation, stiffness and a high tolerance for cycle fatigue. Accordingly, SUS Grade 301 can be used to form a durable spring clip 200 while providing a rigid mounting structure for mounting portion 204. It should be noted that retention apparatus 110 can also be formed from other types of materials including, but not limited to, other grades of steel, metal alloys, copper, nickel, and copper titanium metal. Furthermore, the retention apparatus 110 can be formed from a single piece of material or from a composite material.

Figure 3A:
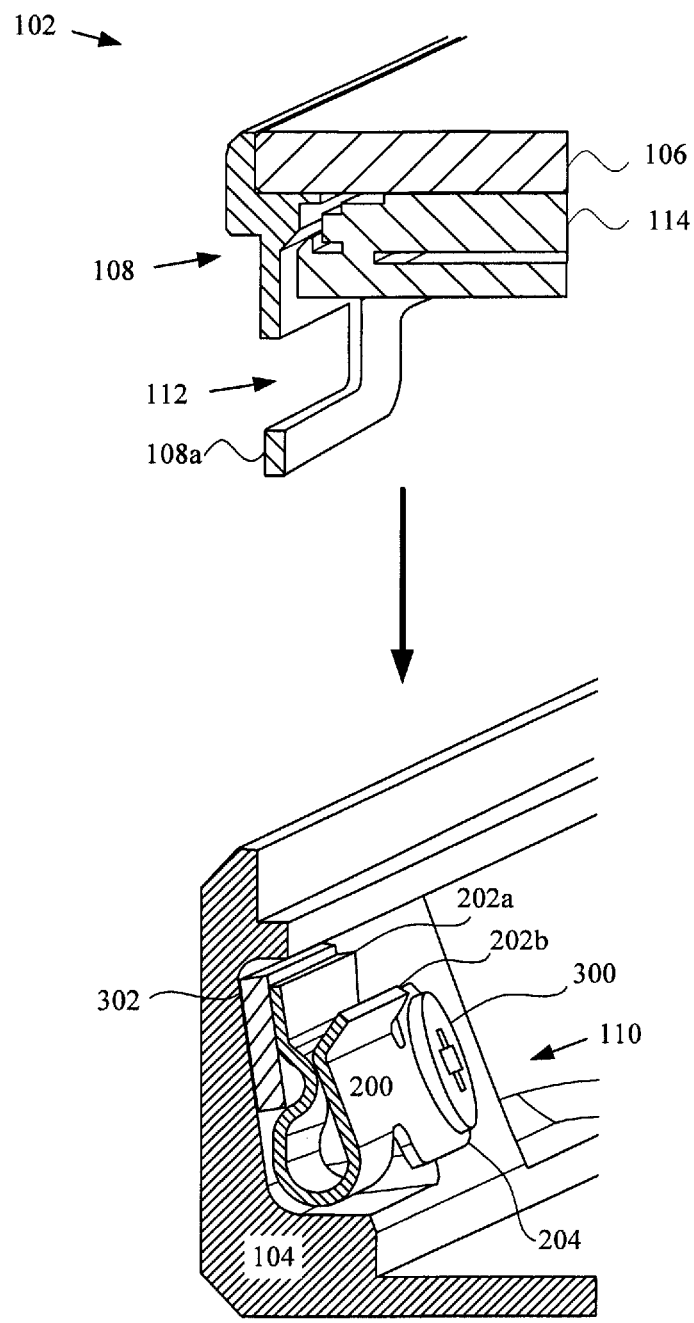
FIGS. 3A-3C show partial cross-sectional views of a rail and a retention apparatus during an assembly operation.
Figure 3B:
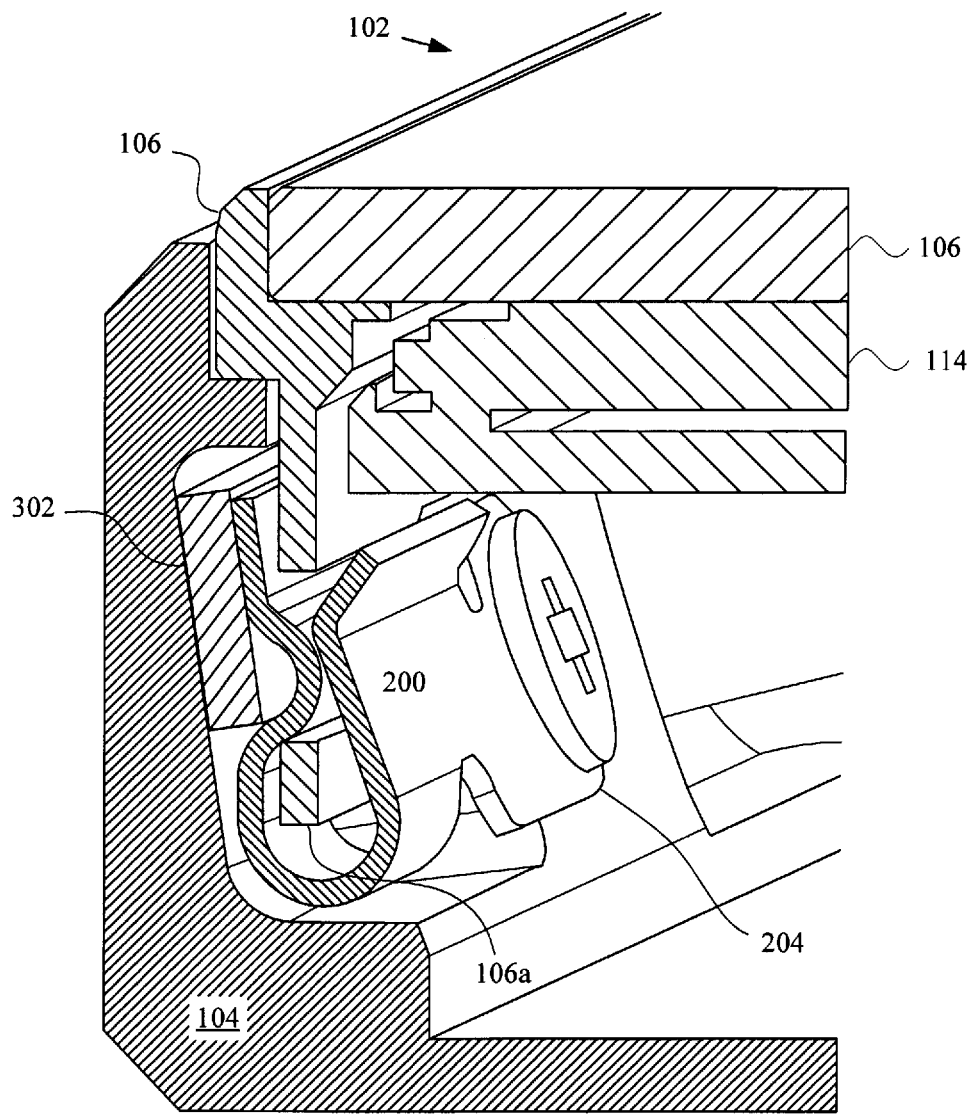
Figure 3C:
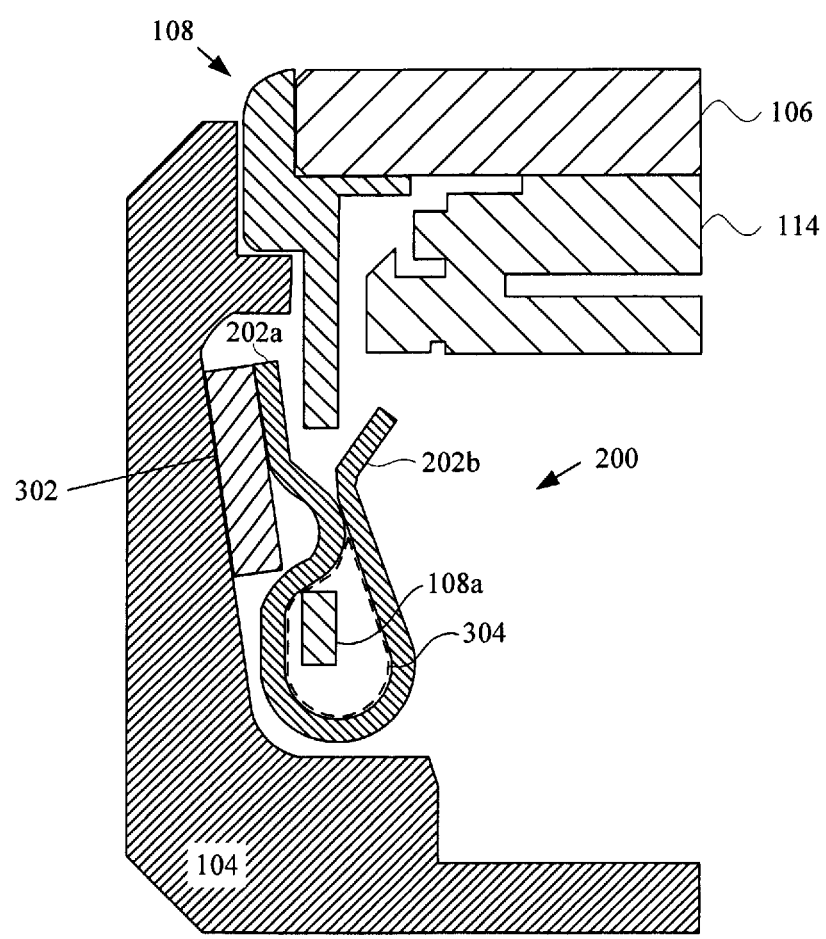

FIGS. 3A-3C show cross-sectional views of rail 108 and retention apparatus 110 during an assembly operation. In FIG. 3A, cover component 102 and housing component 104 are depicted prior to assembly. As previously discussed, cover component 102 can include protective cover 106 and display assembly 114. Display assembly 114 can be mounted to a portion of protective cover 106. Housing component 104 includes one or more surfaces that can be used to mount various components. In this regard, fastener 300 and mounting portion 204 cooperate to mount retention apparatus 110 to a mounting surface of housing component 104. Compressible layer 302 is disposed between a portion of arm 202a and an interior surface of housing component 104. In this embodiment, the interior surface is associated with a side wall of housing component 104. Compressible layer 302 can be adhesively coupled to the interior surface and/or retention apparatus 110. Compressible layer 302 is discussed in more detail below.

The assembly operation can include aligning rail 108 with retention apparatus 110. The alignment can include positioning leading edge portion 108a directly over spring clip 200. Next, rail 108 and retention apparatus 110 are forced against each other such that leading edge portion 108a exerts an insertion force on spring clip 200. The insertion force can cause arm 202a to exert a force against compressible layer 302, which in turn can cause compressible layer 302 to exert a reaction force on arm 202a that resists separation of arm 202a and arm 202b. That is, compressible layer 302 provides an addition force that resists separation of arms 202a and 202b. In this regard, the insertion force must overcome the spring force of spring clip 200 and the reaction force of compressible layer 302 in order to separate arm 202a from arm 202b and allow leading edge portion 108a to pass through a separation between arm 202a and arm 202b (i.e., leading edge portion 108a is received by spring clip 200). The magnitude of the reaction force can be in accordance with a rate at which the insertion force is applied. Accordingly, to conveniently couple leading edge portion 108a to spring clip 200, the insertion force can be applied to spring clip 200 at a rate that invokes a reaction force having a desired or tolerable magnitude. For example, the insertion force can be applied at a rate that is below a threshold value in order to invoke a reaction force having a magnitude smaller than a magnitude of the spring force.

After leading edge portion 108a passes through the separation, the spring force causes spring clip 200 to transition into a closed state. Consequently, arms 202a and 202b contact each other through opening 112. Successful retention of rail 108 can coincide with a "snap" sound. FIGS. 3B and 3C show partial cross-sectional views of electronic device 100 when cover component 102 and housing component 104 are assembled. In the assembled state, rail 108 is retained by retention apparatus 110. In particular, leading edge portion 108a is retained within retaining region 304 that is defined by arms 202a and 202b. Retaining region 304 can be characterized as an inner surface of spring clip 200.

Figure 4A:
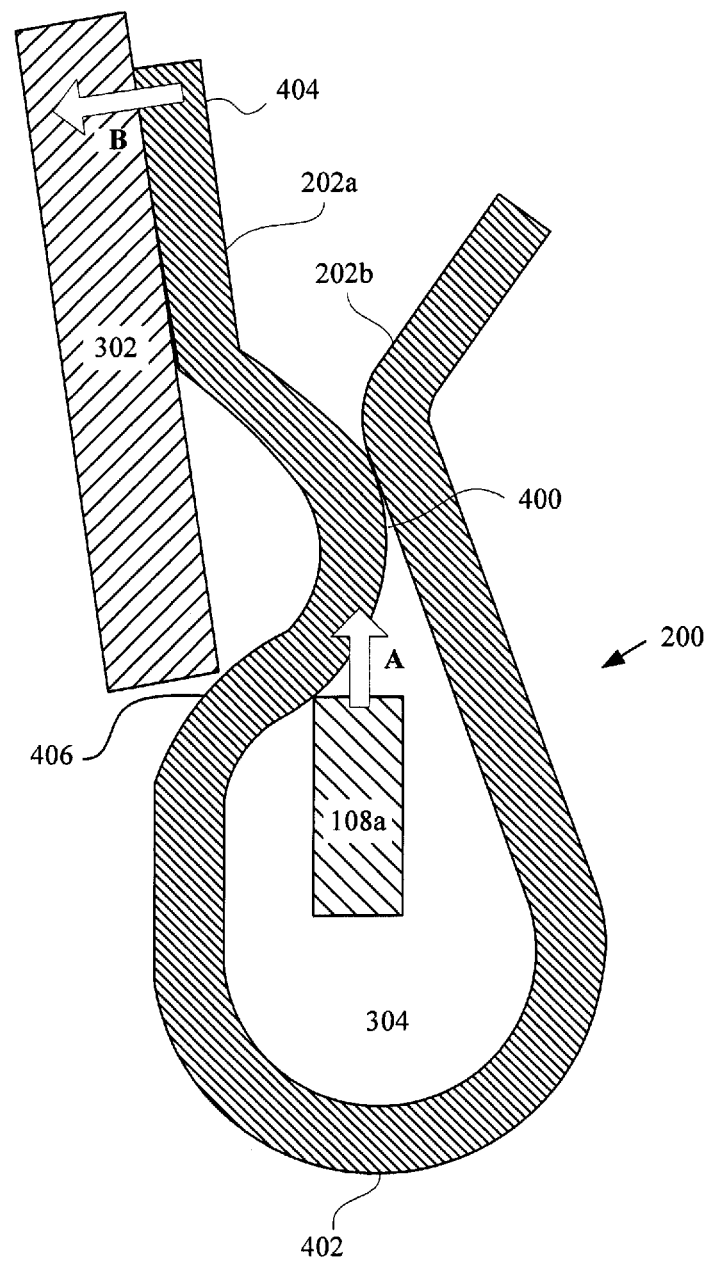
FIGS. 4A and 4B show partial cross-sectional views of a rail retained by a retention apparatus in accordance with some embodiments.
Figure 4B:
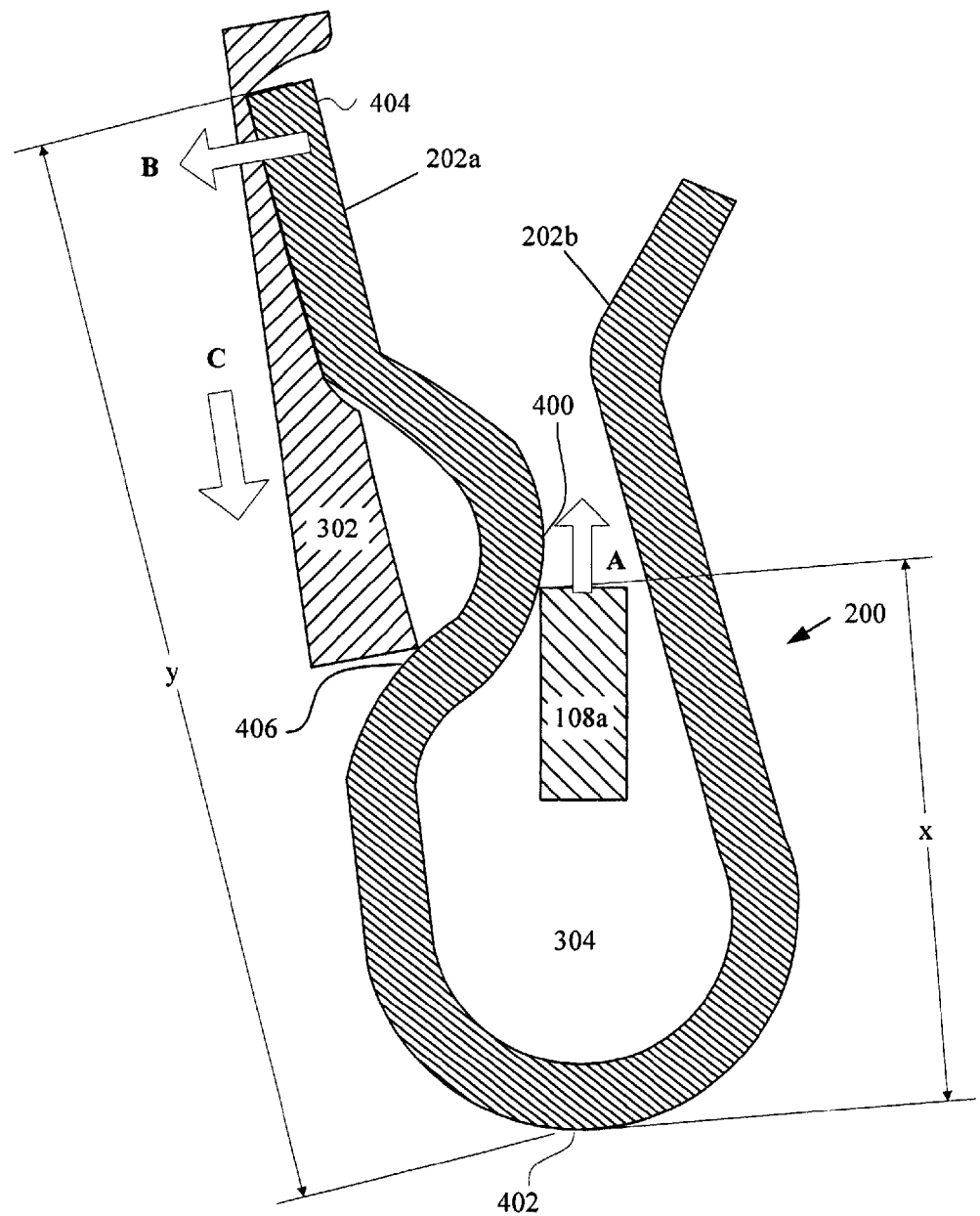

FIGS. 4A and 4B show cross-sectional views of retention apparatus 110, leading edge portion 108a and compressible layer 302. FIG. 4A shows leading edge portion 108a retained within retaining region 304 by spring clip 200. As previously discussed, rail 108 can be released from retention apparatus 110 when leading edge portion 108a exerts an extraction force on spring clip 200. The extraction force can be generated by the application of an external force applied to electronic device 100. In this embodiment, the extraction force can cause leading edge portion 108a to exert an extraction force A on elbow portion 400 of arm 202a. Extraction force A causes arm 202a to rotate about a pivot point 402 of spring clip 200 which in turn, causes arm 202a to move away from arm 202b and towards compressible layer 302. This coincides with end portion 404 of arm 202a moving towards and exerting force B against compressible layer 302. End portion 404 can be a free end of arm 202a. Arm 202b can be substantially stationary with respect to arm 202a when force A is applied. In this regard, arm 202b moves very little compared to arm 202a. This can be due in part to the stability mounting portion 204 provides arm 202b when it is fastened to an interior portion of housing component 104, particularly in the case when mounting portion 204 is integrally formed with arm 202b. The stability of arm 202b can also be due in part to the dimensions and composition of arm 202b. For example, arm 202b can be formed from a material that is less flexible than the material used to form arm 202a and/or can be thicker than arm 202a.

FIG. 4B shows arm 202a compressing compressible layer 302. As extraction force A is applied to elbow portion 400, extraction force A is transmitted by arm 202a such that force B is applied directly to compressible layer 302. In this regard, arm 202a can be characterized as a lever with a first portion that extends from end portion 404 to elbow portion 400 and a second portion that extends from elbow portion 400 to pivot point 402. Accordingly, the rate at which force B is applied to compressible layer 302 can depend on distance x and/or distance y. For example, due to mechanical advantage, as distance y increases, the distance end portion 404 travels increases when force A is exerted, which in turn increases the rate at which force B is applied to compressible layer 302. Hence, the ratio of distance x to distance y can be selected in order to "tune" the response of the retention system. In this regard, arm 202a can be increased in length in order to amplify a rate at which force B is applied to compressible layer 302 or decreased in length to reduce a rate at which force B is applied to compressible layer 302. As previously discussed, compressible layer 302 can provide a dynamic response that depends upon a rate at which force B is exerted on compressible layer 302. Hence, the "tuning" of distance x or y affects how force B compresses compressible layer 302 which in turn affects the response provided by compressible layer 302 that assists in retaining rail 108. For example, increasing the length of arm 202a in order to amplify a rate at which force B is applied to compressible layer 302 would cause the compressible layer 302 to exert a greater reaction force that resists separation of arm 202a and arm 202b.

In response to experiencing force B, compressible layer 302 can resist the separation of arm 202a and arm 202b by providing a reaction force that resists compression of compressible layer 302. Accordingly, compressible layer 302 resists movement of arm 202a in at least in the direction of force B and thereby resists arm 202a from separating from arm 202b. In this regard, a reaction force provided by compressible layer 302 effectively increases a retention force that assists in keeping arms 202a and 202b together. In turn, this can prevent leading edge portion 108a from overcoming the retention force provided by spring clip 200 and compressible layer 302, thereby preventing passage of leading edge portion 108a between arms 202a and 202b. The reaction force can vary based on how quickly compressible layer 302 is being compressed, referred to as a speed of compression or strain rate, which can depend on a rate at which force B is applied, which in turn depends upon a rate at which force A is applied. Hence, the reaction force can depend on a rate at which leading edge portion 108a applies force A to spring clip 200. The reaction force can be characterized as a compression resiliency or a compression resistance that compressible layer 302 exhibits when it is compressed. For example, the compression resiliency of compressible layer 302 can be proportional to a rate at which arm 202a compresses a portion of compressible layer 302. A slow and steady application of force A can be associated with cover component 102 being pulled away slowly, resulting in a gradual application of force B on compressible layer 302 via arm 202a. Compressible layer 302 can respond by exhibiting a low compressive resiliency. Consequently, arm 202a can easily compress compressible layer 302, move away from arm 202b, and allow the release of leading edge portion 108a from retaining region 304. A fast and abrupt application of force A can be associated with a drop event, resulting in a fast and abrupt application of force B upon compressible layer 302. Compressible layer 302 can respond by exhibiting a high compressive resiliency whereby arm 202a cannot easily compress compressible layer 302, preventing or minimizing a separation between arms 202a and 202b such that leading edge portion 108a remains retained by spring clip 200. Compression resiliency can be represented by units of pressure or units of force per unit length.

In some embodiments, a portion of arm 202a at 406 can be dimensioned to support compressible layer 302 such that compressible layer 302 stays in position with respect to retention apparatus 110, particularly with respect to arm 202a. This can be useful when compressive layer 302 experiences a force, such as force C, that can move compressible layer 302 from its desired position. Force C can be due to gravity and/or be a component of force B. The support provided at 406 can also be beneficial after repeat dynamic loading events that can cause the adhesive integrity between the interior portion of housing component 104 and compressible layer 302 to degrade.

Compressible layer 302 can be made from a material that exhibits the variable compressibility described herein. In some embodiments, compressible layer 302 can be formed from visco-elastic foam. For example, compressible layer 302 can be formed from polyurethane foam. It should be noted that compressible layer 302 can also be formed from other types of materials including, but not limited to, silicon, ethylene and/or any other material that exhibits variable compression in reaction to a rate at which force is applied to it.

Figure 5:
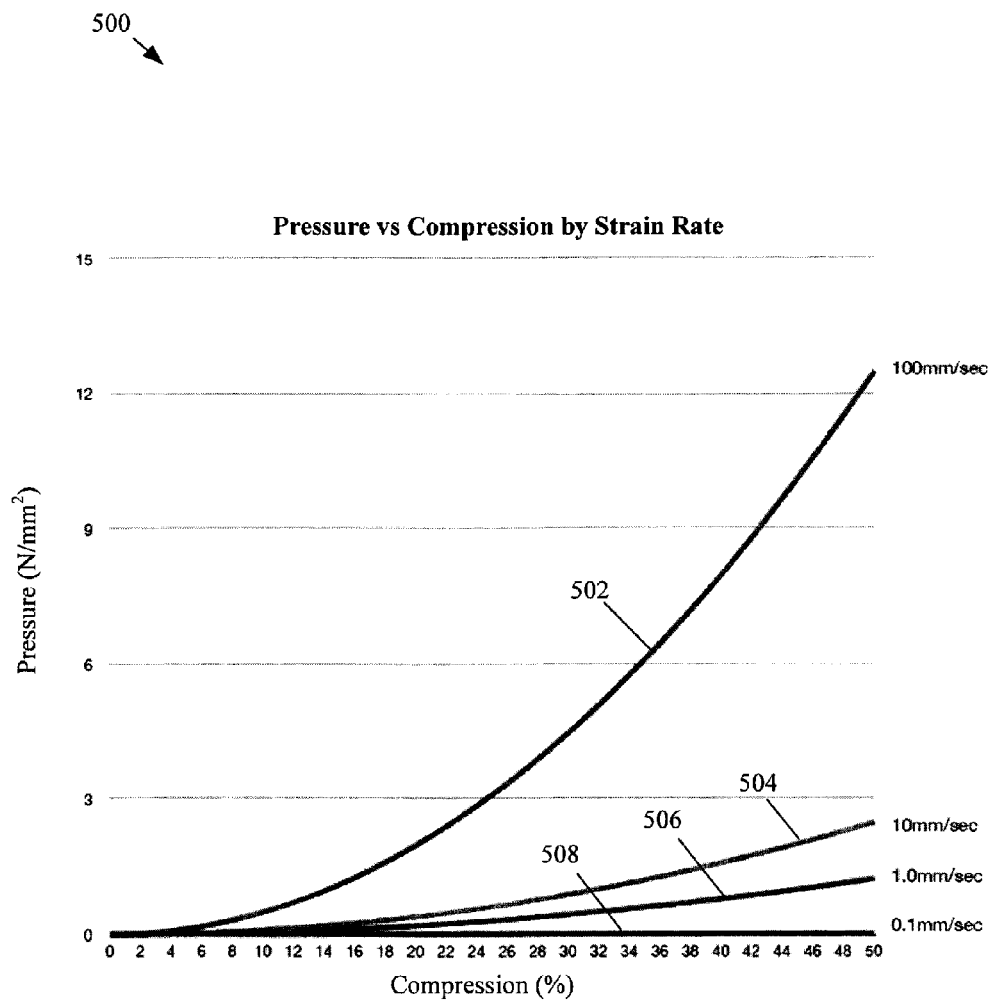
FIG. 5 shows a graph illustrating the relationship between pressure and an amount of compression for various strain rates.

FIG. 5 shows a graph 500 illustrating the relationship between an amount of pressure an exemplary compressible layer 302 provides and an amount of compression for various strain rates exerted on compressible layer 302. An amount of pressure compressible layer 302 provides corresponds directly to an amount of force, e.g. a reaction force, that compressible layer 302 exerts over a particular area. In some exemplary cases, the area can correspond to the contact area between arm 202a and compressible layer 302. In this regard, a variable reaction force provided by compressible layer 302 can also be expressed in the form of pressure. In this embodiment, pressure is represented by Newtons per square millimeters ($N/mm^2$). An amount of compression is represented by a percentage (%) of how much compressible layer 302 is compressed. For example, at 0% compressible layer 302 is not compressed at all and maintains its original thickness. At 50%, a thickness of compressible layer 302 is reduced by half. Plots 502, 504, 506, and 508 are associated with strain rates in descending order respectively. The depicted strain rate plots represents a rate at which compressible layer 302 is compressed when a force is applied to compressible layer 302, e.g., force B in FIGS. 4A and 4B. Strain rate is represented in units of millimeters per second (mm/sec).

As shown in graph 500, a low strain rate, e.g. plot 508, results in less pressure for a given amount of compression while a high strain rate, e.g., plot 502, results in a higher pressure for the same amount of compression. Hence, application of an extraction force causing a high strain rate would need a substantially greater magnitude to compressible layer 302 at a given amount of compression than a magnitude of an extraction force that is applied resulting in a low strain rate for the same amount of compression. For example, at 50% compression, application of a force resulting in a strain rate of 100 mm/sec would need to overcome pressure of about 12 $N/mm^2$ as indicated by plot 502 while application of a force resulting in a strain rate of 1.0 mm/sec, such as plot 506, would only need to overcome pressure of about 1.5 $N/mm^2$. Accordingly, a compressible layer that exhibits the properties in graph 500 can be utilized in conjunction with a spring clip to provide a variable retention force that can assist in distinguishing intentional events from unintentional events and provide an appropriate response.

Figure 6:
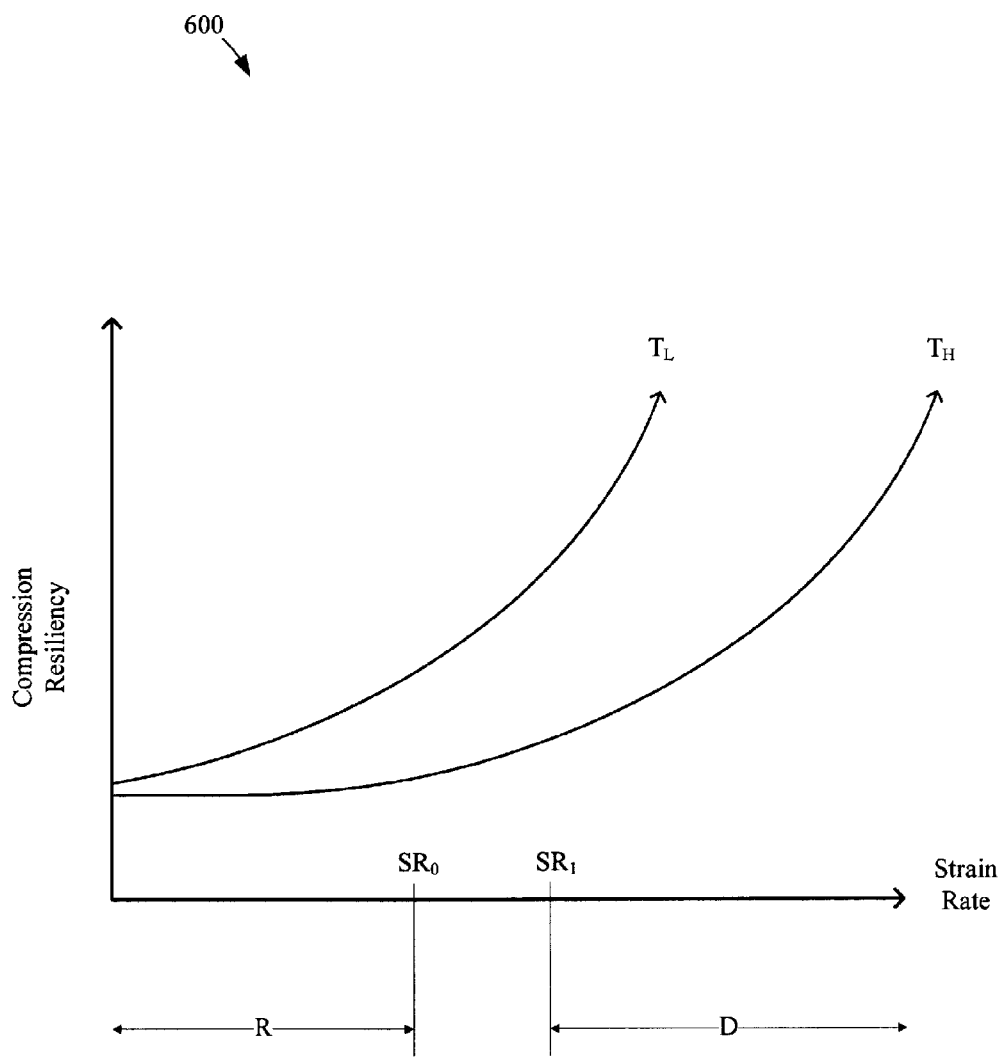
FIG. 6 shows a graph illustrating the relationship between compression resiliency and strain rate for a compressible layer.

FIG. 6 shows a graph 600 illustrating the relationship between strain rate and compression resiliency (or resistance) of an exemplary compressible layer 302. In the rework region R, the strain rates are relatively slow. For example, a strain rate value in the rework region can include exerting force at a rate that causes compressible layer 302 to compress at an initial rate of about 1 mm/second. Region R can be characterized as strain rates that are less than a strain rate threshold value $SR_0$. In the drop event region D, strain rates can be an order of magnitude higher with respect to strain rates in the rework region R. For example, a strain rate value in the drop event region D can include exerting a force at a rate that causes compressible layer 302 to compress at an initial rate of about 10 mm/second. Region D can be characterized as strain rates that are greater than a strain rate threshold value $SR_1$.

The depicted plots $T_L$ and $T_H$ depict how compression resiliency of compressible layer 302 can be highly dependent upon the temperature of compressible layer 302. In this regard, compressible layer 302 can be made from a material that is sensitive to temperature. For example, compressible layer 302 can be made from a silicon body filled with a phase changing material that is triggered by temperature. Plot $T_L$ is associated with a compressible layer 302 that is at a first temperature and plot $T_H$ is associated with a compressible layer 302 is at a second temperature greater than the first temperature. As shown in graph 600, plot $T_H$ is similar to plot $T_L$ but is shifted to the right. In this regard, increasing a temperature of compressible layer 302 reduces the compression resiliency of compressible layer 302 for a given strain rate value. Prior to performing a rework operation, the strain rate sensitivity of compressible layer 302 can be tuned in order to make it easier to remove cover component 102. For example, the temperature of electronic device 100 can be increased in order to increase the temperature of compressible layer 302. Increasing the temperature of compressible layer 302 can lower the compression resiliency of the compressible layer within the rework region range, thereby reducing the amount of resistance encountered when removing cover component 102 from housing component 104.

Figure 7A:
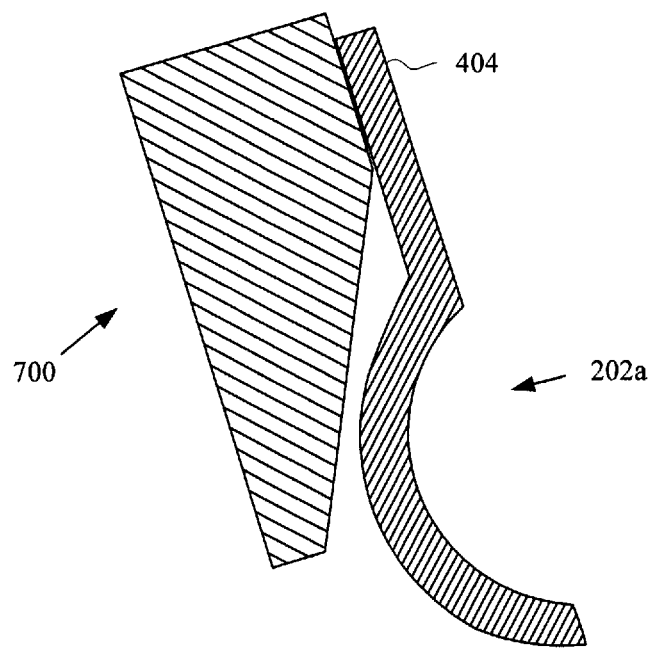
FIG. 7A shows a partial cross-sectional view of a compressible layer and a spring arm in accordance with some embodiments.
Figure 7B:
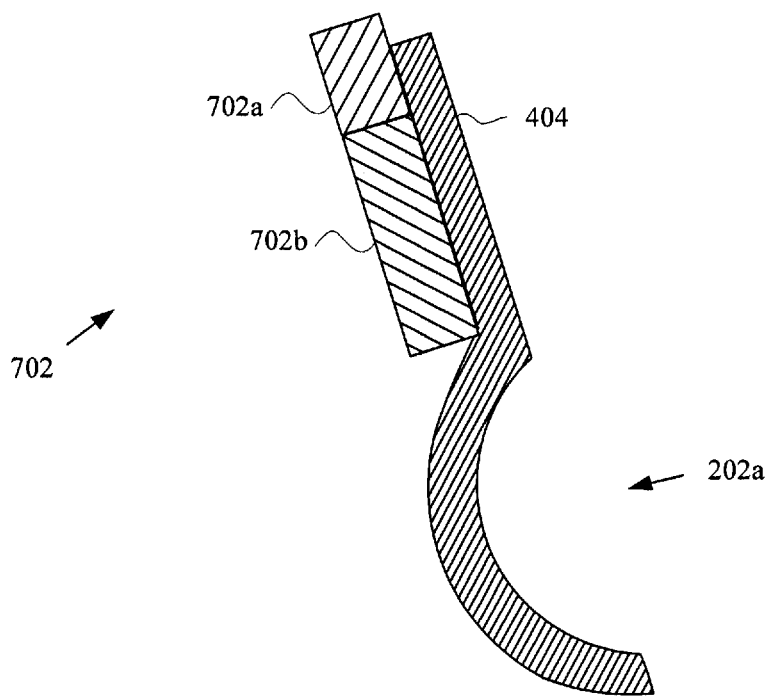
FIG. 7B shows a partial cross-sectional view of a compressible layer and a spring arm in accordance with some embodiments.

FIGS. 7A and 7B show cross-sectional side views of alternative embodiments of a compressible layer. The volume, dimension and/or material of a compressible layer can be changed in order to configure the compressible layer to have a desired strain rate sensitivity. Changing the volume and dimension can be particularly beneficial in the case where a compressible layer is made from material that has a linear strain rate response. Referring to FIG. 7A, compressible layer 700 illustrates how the dimension/geometry of a compressible layer can be configured in order to tune the strain rate sensitivity of the retention system. Compressible layer 700 has a non-uniform cross-sectional thickness such that compressible layer 700 is thicker near end portion 404. End portion 404 can be a portion of arm 202a where arm 202a can exert the highest mechanical advantage and highest rate at which a force (e.g., force B in FIGS. 4A and 4B) is applied to compressible layer 700. Accordingly, compressible layer 700 can be oriented with respect to arm 202a such that the thick portion will receive a force from end portion 404. Referring to FIG. 7B, compressible layer 702 can include a first portion 702a made from a first material and a second portion 702b made from a second material different from the first material. The first material can have a greater compression resiliency than the second material. Accordingly, compressible layer 702 can be oriented with respect to arm 202a such that first portion 702a will receive a force from end portion 404.

Figure 8A:
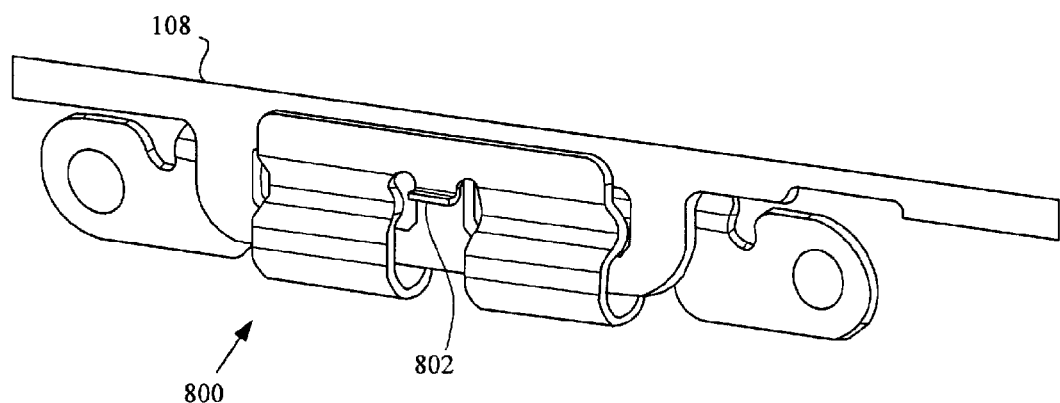
FIG. 8A shows a retention apparatus in accordance with some embodiments.
Figure 8B:
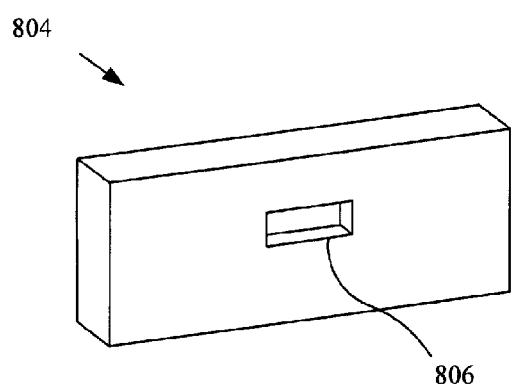
FIG. 8B shows a compressible layer in accordance with some embodiments.

FIG. 8A shows a perspective view of rail 108 when retained by retention apparatus 800. Retention apparatus 800 is similar to retention apparatus 110 with the difference being retention apparatus 800 includes retention feature 802. Retention feature 802 is configured to assist in retaining and aligning compressible layer 804 with respect to retention apparatus 800. In this embodiment, retention feature 802 is in the form of a tab that protrudes from an arm of retention apparatus 800. FIG. 8B shows a compressible layer 804 that includes a cavity 806 that is configured to cooperate with retention feature 802 such that when compressible layer 804 is in contact with retention apparatus 800, cavity 806 can receive retention feature 802. Once received, the cavity 806 and retention feature 802 resists movement of compressible layer 804 with respect to retention apparatus 800. For example, retention feature 802 can be operative to assist an adhesive layer that couples compressible layer 804 in place, or even to retain compressible layer 804 in place on its own.

Figure 9:
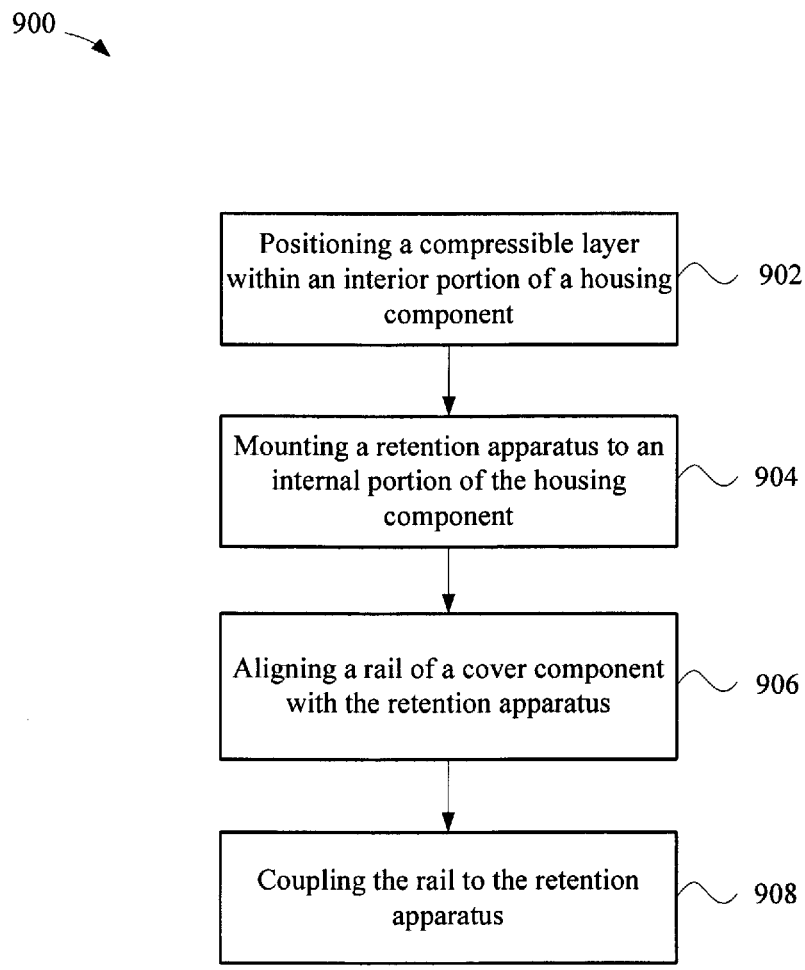
FIG. 9 shows a flow chart detailing the steps of a process for assembling an electronic device in accordance with some embodiments.

FIG. 9 shows a flowchart detailing an assembly operation 900 for assembling an electronic device. Assembly operation 900 can be carried out with a machine, manually by a laborer or a combination thereof. Assembly operation 900 can include assembling a cover component and a housing component of the electronic device. Step 902 includes positioning a compressible layer within an interior portion of the housing component. In some embodiments, the compressible layer can be adhesively coupled to an interior surface of the housing component during this step. For example, the compressible layer can be glued to a side wall of the housing component. Next, a retention apparatus can be mounted to an internal portion of the housing component at step 904. For example, the retention apparatus can be fastened with an interior surface of a wall of the housing component using one or more fasteners along the lines of a screw. The internal portion can be a portion of the housing component or a mounting surface disposed within the housing component. The retention apparatus is mounted within the housing component such that a portion of the compressible layer is contacting the retention apparatus. In some embodiments, features of the compressible layer and the retention apparatus can indicate whether the compressible layer was positioned within the interior portion correctly. For example, if retention feature 802 and cavity 806 are misaligned when retention apparatus 800 is mounted to the internal portion of the housing component, this can indicate compressible layer 804 is incorrectly positioned within the housing component. Compressible layer 804 can subsequently be repositioned such that cavity 806 properly receives retention feature 802 when retention apparatus 800 is mounted to the internal portion of the housing component. In embodiments where the electronic device includes a plurality of retention apparatuses, step 902 and step 904 can be repeated for each retention apparatus.

Step 906 includes aligning a rail of the cover component with the retention apparatus. This can include aligning a leading edge portion of the rail with a spring clip of the retention apparatus. In some embodiments, proper alignment of the rail and the retention apparatus coincides with proper alignment of the cover component and the housing component. In this regard, the rail and retention apparatus system can also serve as an alignment guide for aligning the cover and housing components. Next, the rail is coupled to the retention apparatus at step 908. Step 908 can include pushing the cover and housing component together until the rail is retained by the retention apparatus. In some embodiments, pushing the cover and housing components together can include the leading edge portion of the rail exerting an insertion force on a spring clip of the retention apparatus. The insertion force can be applied at a rate that invokes a desired response from the compressible layer such that leading edge portion can be inserted into the spring clip without significant resistance. The desired response can correspond to the applying the insertion force at a rate that is less than a threshold value. As previously discussed, coupling of the rail to the retention apparatus can result in a "snap" sound that indicates a successful retention.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing and/or assembly operations or as computer readable code on a computer readable medium for controlling a manufacturing/assembly line. The computer readable storage medium is any data storage device that can store data which can thereafter be read by a computer system. Examples of the computer readable storage medium include read-only memory, random-access memory, CD-ROMs, HDDs, DVDs, magnetic tape, and optical data storage devices. The computer readable storage medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. An electronic device, comprising:
   a first housing component having an attachment feature;
   a second housing component having a plurality of walls that define a cavity; and
   a retention system coupling the first housing component to the second housing component, the retention system comprising:
      a spring clip coupled with an interior surface of one of the walls of the second housing component, the spring clip comprising a first retention member and a second retention member that cooperate to surround and retain the attachment feature, wherein the first and second retention members are biased together by a spring force that opposes separation of the first and second retention members, and
      a compressible layer that exerts a reaction force upon the second retention member in response to an externally applied force, a magnitude of the reaction force being proportional to a rate at which the external force is applied,
   wherein the reaction force cooperates with the spring force to oppose separation of the first and second retention members, thereby resisting release of the attachment feature from the spring clip.

2. The electronic device of claim 1, wherein a portion of the compressible layer is disposed between the second retention member and the interior surface of the one wall.

3. The electronic device of claim 2, wherein the spring clip further comprises a mounting portion integrally formed with the first retention member and the spring clip is coupled with the interior surface of the one wall using the mounting portion.

4. The electronic device of claim 1, wherein the spring clip is formed from a single piece of metal.

5. The electronic device of claim 1, wherein the first housing component is a cover component and the second housing component receives the cover component at an opening of the cavity.

6. The electronic device of claim 1, wherein the attachment feature is a leading edge portion of a rail that extends from a bottom surface of the first housing component and the leading edge portion defines in part an opening of the rail that is interlocked with the spring clip.

7. The electronic device of claim 6, wherein the externally applied force causes the leading edge portion of the rail to exert an extraction force on an inner surface of the spring clip.

8. A retention system for resisting disassembly of an electronic device, the retention system comprising:
- a spring clip having a first retention member and a second retention member biased together by a spring force that opposes separation of the first and second retention members;
- a compressible layer disposed against an outer surface of the second retention member such that when an extraction force is exerted on the compressible layer by way of the second retention member, the compressible layer cooperates with the spring clip to oppose separation between the first and second retention members by exerting a reaction force upon the second retention member having a magnitude in accordance with a rate at which the extraction force is exerted on the compressible layer.

9. The retention system of claim 8, wherein the reaction force has a first magnitude when the extraction force is exerted on the compressible layer at a first rate and has a second magnitude greater than the first magnitude when the extraction force is exerted on the compressible layer at a second rate greater than the first rate.

10. The retention system of claim 8, wherein the magnitude of reaction force depends upon a temperature of the compressible layer.

11. The retention system of claim 8, wherein the reaction force resists the second retention member from moving away from the first retention member.

12. The retention system of claim 8, wherein the first retention member stays substantially stationary with respect to the second retention member when the extraction force causes a separation between the first and second retention members.

13. The retention system of claim 8, wherein the second retention member comprises an elbow portion and a free end, and the second retention member directly contacts the first retention member at the elbow portion when the first and second arms are biased together.

14. The retention system of claim 8, wherein the magnitude of the reaction force depends on an amount of compression of a portion of the compressible layer.

15. The retention system of claim 8, wherein the compressible layer has a non-uniform cross-sectional thickness.

16. The retention system of claim 8, wherein the compressible layer is made from visco-elastic foam.

17. A method for assembling a retention system within an electronic device, the retention system including a compressible layer operable to exert a variable reaction force that cooperates with a spring clip to prevent an opening of the spring clip when an insertion force is applied to the spring clip at a rate greater than a threshold value, the method comprising:
- mounting the spring clip within an interior portion of a first housing component such that the spring clip directly contacts the compressible layer; and
- applying the insertion force to the spring clip with an attachment feature of a second housing component at a rate less than the threshold value, thereby causing the spring clip to open and receive the attachment feature of the second housing component.

18. The method of claim 17, wherein a magnitude of the reaction force depends on a temperature of the compressible layer.

19. The method of claim 17, further comprising aligning the attachment feature of the second housing component with the spring clip prior to applying the insertion force on the spring clip.

20. The method of claim 17, wherein mounting the spring clip within the interior portion of the first housing component comprises positioning the spring clip such that a retention feature of the spring clip cooperates with a portion of the compressible layer to assist in keeping the compressible layer in position with respect to the spring clip.

* * * * *